(12) United States Patent
Kubby et al.

(10) Patent No.: US 6,362,512 B1
(45) Date of Patent: Mar. 26, 2002

(54) MICROELECTROMECHANICAL STRUCTURES DEFINED FROM SILICON ON INSULATOR WAFERS

(75) Inventors: Joel A. Kubby, Rochester, NY (US); Jingkuang Chen, Ann Arbor, MI (US); Alex T. Tran, Ithaca, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/468,423

(22) Filed: Dec. 21, 1999

Related U.S. Application Data
(60) Provisional application No. 60/113,777, filed on Dec. 23, 1998.

(51) Int. Cl.[7] .............................................. H01L 29/82
(52) U.S. Cl. .......................... 257/415; 257/619; 438/50; 438/459; 438/723
(58) Field of Search .......................... 257/415, 417–420, 257/619, 644, 650; 438/50–53, 459, 977, 723, 743

(56) References Cited

U.S. PATENT DOCUMENTS

| | | | |
|---|---|---|---|
| 5,646,928 A | * | 7/1997 | Wu et al. ..................... 369/112 |
| 6,074,890 A | * | 6/2000 | Yao et al. ...................... 438/52 |

FOREIGN PATENT DOCUMENTS

| DE | WO 200036387 A1 | * 6/2000 | ........... G01L/13/02 |
|---|---|---|---|

OTHER PUBLICATIONS

Micro–Machined Three–Dimensional Micro–Optics for Integrated Free–Space Optical System, L. Y. Lin, S. S. Lee and K. S. J. Pister, 1994.

Microfabricated Hinges, K. s. J. Pister, M. W. Judy, S. R. Burgett and R. S. Fearing, Mar. 1992.

Surface Micromachining for Microsensors and Microactuators, Roger T. Howe, J. Vac. Sci. Technol. B6(6), Nov./Dec. 1999.

Advanced Silicon Etching Using High Density Plasmas, J. K. Bhardwaj and H. Ashraf, SPIE vol. 2639.

* cited by examiner

*Primary Examiner*—Nathan Flynn
*Assistant Examiner*—Scott R. Wilson
(74) *Attorney, Agent, or Firm*—Robert A. Burtzlaff; David E. Henn (57) ABSTRACT

A device structure is defined in a single-crystal silicon (SCS) layer separated by an insulator layer, such as an oxide layer, from a handle wafer. The SCS can be attached to the insulator by wafer bonding, and is selectively etched, as by photolithographic patterning and dry etching. A sacrificial oxide layer can be deposited on the etched SCS, on which polysilicon can be deposited. A protective oxide layer is deposited, and CMOS circuitry and sensors are integrated. Silicon microstructures with sensors connected to CMOS circuitry are released. In addition, holes can be etched through the sacrificial oxide layer, sacrificial oxide can be deposited on the etched SCS, polysilicon can be deposited on the sacrificial oxide, PSG can be deposited on the polysilicon layer, which both can then be patterned.

8 Claims, 10 Drawing Sheets

MICROELECTROMECHANICAL STRUCTURES DEFINED FROM SILICON ON INSULATOR WAFERS

Priority is claimed to Provisional patent application, Serial No. 60/113,777, Filed Dec. 23, 1998, entitled; SILICON ON INSULATOR SURFACE MICROMACHINING PROCESS, by Joel A. Kubby, Jingkuang Chen and Alex T. Tran.

FIELD OF THE INVENTION

Microelectromechanical structures defined on silicon on insulator wafers are described. More particularly, micromachined structures monolithically integrated with CMOS circuitry are described.

BACKGROUND AND SUMMARY OF THE INVENTION

Inherent thin film properties of materials limit many surface micromachining processes. For example, variability of materials properties in polysilicon thin films (such as, for example, Young's modulus and Poisson's ratio, residual stress, and stress gradients) can prohibit manufacture of desired microstructures. This is particularly apparent in microoptical components such as mirrors, lenses, and diffraction gratings, which must be very flat for high-optical performance, and normally have to be made in the single crystal silicon layer. Since conventional surface micromachining requires that all components be made in polysilicon layers, optical performance can be limited.

The leading commercial microelectromechanical (MEMS) processing technologies are 1) bulk micromachining of single crystal silicon, and 2) surface micromachining of polycrystalline silicon. Each of these processing technologies has associated benefits and barriers. Bulk micromachining of single crystal silicon, an excellent material with well controlled electrical and mechanical properties in its pure state, has historically utilized wet anisotropic wet etching to form mechanical elements. In this process, the etch rate is dependent on the crystallographic planes that are exposed to the etch solution, so that mechanical elements are formed that are aligned to the rate limiting crystallographic planes. For silicon these planes are the (1,1,1) crystal planes. The alignment of mechanical features to the crystallographic planes leads to limitations in the geometries that can be generated using this technique. Typical geometries include v-groove trenches and inverted pyramidal structures in (1,0,0) oriented silicon wafers, where the trenches and inverted pyramids are bound by (1,1,1) crystallographic planes. Geometries that include convex corners are not allowed unless additional measures are taken to protect etching of the crystal planes that make up the corners. The etch rate also varies with dopant concentration, so that the etch rate can be modified by the incorporation of dopant atoms, which substitute for silicon atoms in the crystal lattice. A boron dopant concentration on the order of $5 \times 10^{19}/cm^3$ is sufficient to completely stop etching, so that mechanical elements bounded by other crystal planes can be generated by using dopant "etch stop" techniques. However dopant concentrations of this magnitude are sufficient to modify the desirable electrical and mechanical properties of the pure single crystal silicon material, leading to device design and manufacturability constraints. Recent advances in Deep Reactive Ion Etching (DRIE) (J. K. Bhardwaj and H. Ashraf, "Advanced silicon etching using high density plasmas", Micromachining and Microfabrication Process Technology, Oct. 23–24, 1995, Austin, Tex., SPIE Proceedings Vol. 2639, pg. 224) which utilizes sidewall passivation and ion beam directionality to achieve etch anisotropy, has relaxed the in-plane geometric design constraints, but still require etch stop techniques to control the depth of the etch into the wafer, and additional processing steps are required to undercut a structure to release it from the substrate.

In contrast, surface micromachining of polycrystalline silicon utilizes chemical vapor deposition (CVD) and reactive ion etching (RIE) patterning techniques to form mechanical elements from stacked layers of thin films (R. T. Howe, "Surface micromachining for microsensors and microactuators", J. Vac. Sci. Technol. B6, (1988) 1809). Typically CVD polysilicon is used to form the mechanical elements, CVD nitride is used to form electrical insulators, and CVD oxide is used as a sacrificial layer. Removal of the oxide by wet or dry etching releases the polysilicon thin film structures. The advantage of the surface micromachining process is the ability to make complex structures in the direction normal to the wafer surface by stacking releasable polysilicon layers (K. S. J. Pister, M. W. Judy, S. R. Burgett, and R. S. Fearing, "Microfabricated hinges", Sensors and Actuators A33, (1992) 249 and L. Y. Lin, S. S. Lee, K. S. J. Pister, and M. C. Wu, "Micromachined three-dimensional micro-optics for free-space optical system", IEEE Photon. Technol. Lett. 6, (1994) 1445) and complete geometric design freedom in the plane of the wafer since the device layers are patterned using isotropic RIE etching techniques. An additional advantage of surface micromachining is that it utilizes thin film materials such as polysilicon, oxide, nitride, and aluminum, that are commonly used in microelectronic device fabrication, albeit with different materials properties that are optimized for mechanical rather than electrical performance. This commonality in materials allows for increased integration of microelectronic and micromechanical components into the same fabrication process, as demonstrated in Analog Devices' integrated accelerometer, and in SSI Technologies' integrated pressure sensor.

While surface micromachining relaxes many of the limitations inherent in bulk micromachining of single crystal silicon, it nonetheless has its own limitations in thin film properties. The maximum film thickness that can be deposited from CVD techniques are limited to several microns, so that thicker structures must be built up from sequential depositions. Thicker device layers are required for dynamic optical elements where dynamic deformations can impact optical performance, and for optical elements which require additional thin film coatings that can cause stress induced curvature. The thin film mechanical properties, such as Young's modulus and Poisson's ratio, are dependent on the processing parameters and the thermal history of the fabrication process, and can typically vary by as much as 10% from run to run. This is an important limitation for robust manufacturability where these thin film mechanical properties can be a critical parameter for device performance. An additional limitation of conventional surface micromachining is that holes through the mechanical elements must be included in the design to allow the etchants used to release the mechanical elements to reach the sacrificial layers. While this is not an important limitation for optical elements such as Fresnel lenses and diffraction grating that include holes in their design, it is an important limitation for optical elements such as mirrors where holes are a detriment to optical performance. Flatness and reflectivity are also important optical design criteria that can be impacted by conventional surface micromachining processes. Thin film stresses and stress gradients, typical of polysilicon thin films, can lead to warping of optical surfaces. In addition the surface of as-deposited polysilicon thin films is not polished, and thus requires post-processing Chemical Mechanical Polishing (CMP) techniques to obtain an optical quality surface finish.

Since the fabrication technology utilized to produce microoptoelectromechanical (MOEMS) components can lead to manufacturing barriers in the thin film properties associated with the process, the present invention includes an enabling fabrication process for microoptoelectromechanical systems that overcomes the barriers in the optomechanical properties of thin film structures. The key innovation to overcoming these thin film properties is to utilize silicon on insulator (SOI) wafers as the starting substrate in a surface micromachining process (see FIG. 1). SOI is a generic term that refers to a structure in which a silicon layer is supported by a dielectric material. In this embodiment, a silicon device layer, bonded to a conventional silicon handle wafer, has a $SiO_2$ thin-film layer at the interface. This allows critical optical and electronic components to be fabricated in a single crystal silicon device layer, which can be released from the handle wafer by etching the oxide at the interface between the device layer and the substrate. The oxide layer at the interface can also be utilized as a backside etch stop layer for releasing optical components, such as a mirror, that cannot include etch holes. The device layer has a user specified thickness that is appropriate for the given application, and has excellent and reproducible electrical and thin film properties. Both the back and front side of the device layer would be polished, and thus optical elements fabricated in this layer do not require additional post-processing CMP techniques to obtain an optical quality surface finish. Since the device layer is single crystal silicon, it has no intrinsic stress or stress gradients in the absence of thin film coatings. Since it can be made thicker than conventional CVD deposited thin films, optical components fabricated in this layer have minimal distortions after thin film depositions such as aluminum to increase surface reflectivity, or dielectric thin films to decrease surface reflectivity. The additional thickness is also important to minimize distortions for dynamically actuated optical elements.

Additional functions, objects, advantages, and features of the present invention will become apparent from consideration of the following description and drawings of preferred embodiments.

DETAILED DESCRIPTION OF THE INVENTION

Figure 1:
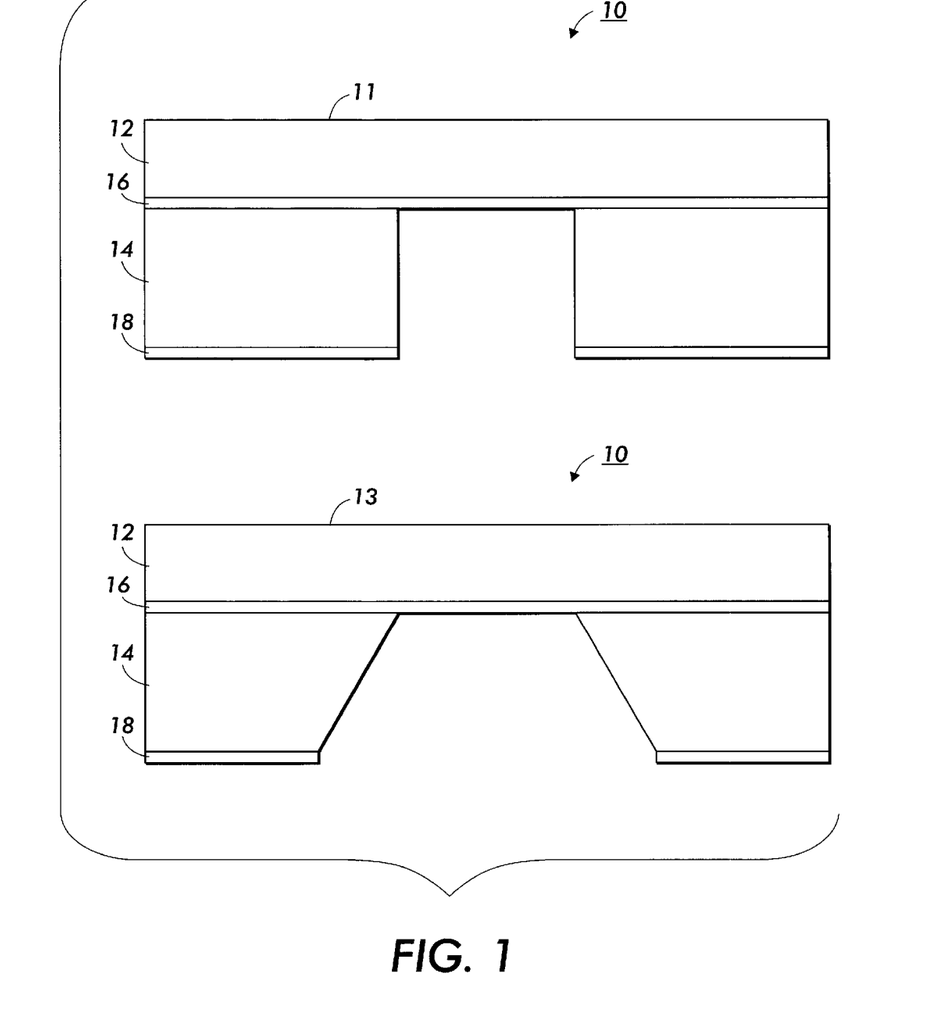
FIG. 1 respectively illustrates an SOI wafer that has been etched to form a membrane using Deep Reactive Ion Etching (DRIE) (upper) or wet anisotropic wet etching (lower)

FIG. 1 shows two substantially identical silicon on insulator (SOI) wafers 10 suitable for use in the present invention. The wafer 10 (created by any conventional SOI technique) is etched to respectively form a membrane using deep reactive ion etching (DRIE) (etched wafer 11) or to form a membrane using wet anisotropic wet etching (etched wafer 13). The SOI wafer 10 includes a thin single crystal silicon device wafer layer 12, and a thick single crystal silicon handle wafer layer 14. Between these two layers 12 and 14 there is an oxide layer 16 that integrally bonds the device layer 12 and handle wafer layer 14. This oxide layer 16 can also be used as an etch stop in wet and dry etching procedures to form a thin membrane. In addition, there is an oxide layer 18 on the back side of the handle wafer layer 14, which is used to control etch down to the interface between the device layer 12 and handle wafer layer 14 from the backside.

Figure 2:
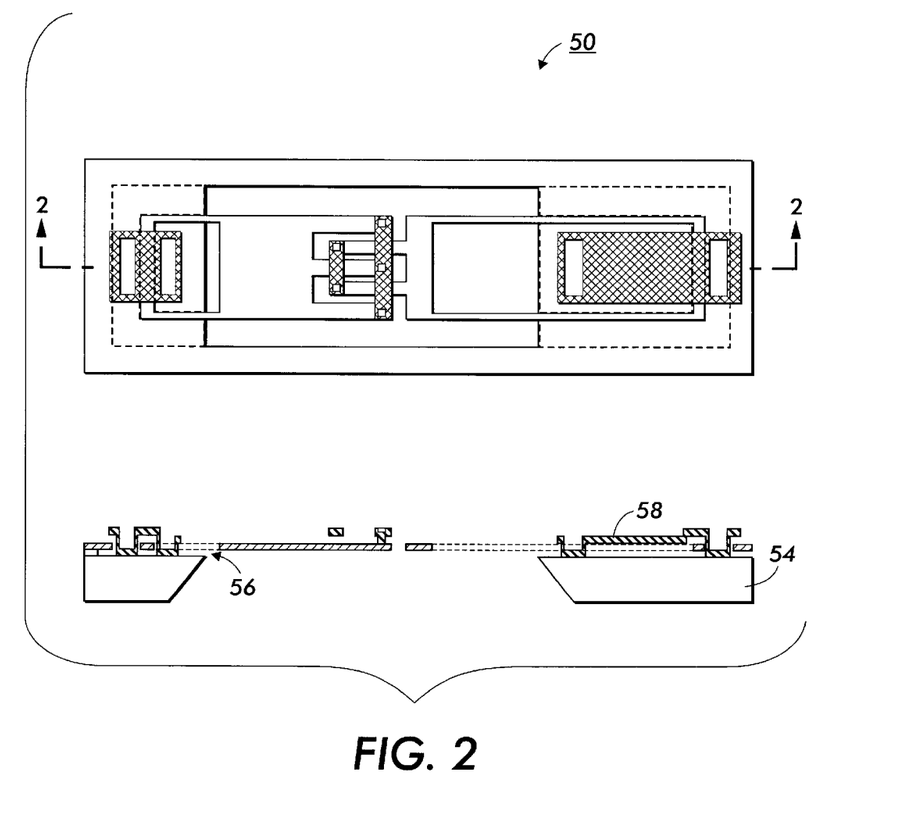
FIG. 2 illustrates in top view and cross section a MEMS device constructed according to the present invention, with single crystal silicon layers forming the bulk of the device and polysilicon layers indicated by cross hatching.

FIG. 2 shows a typical microstructure 50 that can be fabricated with the technique of the present invention. The microstructure 50 is created from single crystal silicon layers 52 overlaying a insulator layer 56 (substantially etched away) and a silicon substrate 54, in conjunction with additional polysilicon layers 56. The thin single crystal silicon layer 52 is used where materials properties such as Young's Modulus and Poisson's Ratio are critical. It can also be utilized where a thick layer is required such as a mirror that must remain flat in the presence of dynamic forces or stress due to thin film depositions. The polysilicon layer 58 can be used as a mechanical layer such as for hinges, guides, and anchors where the mechanical properties of the material are not critical.

Figure 3:
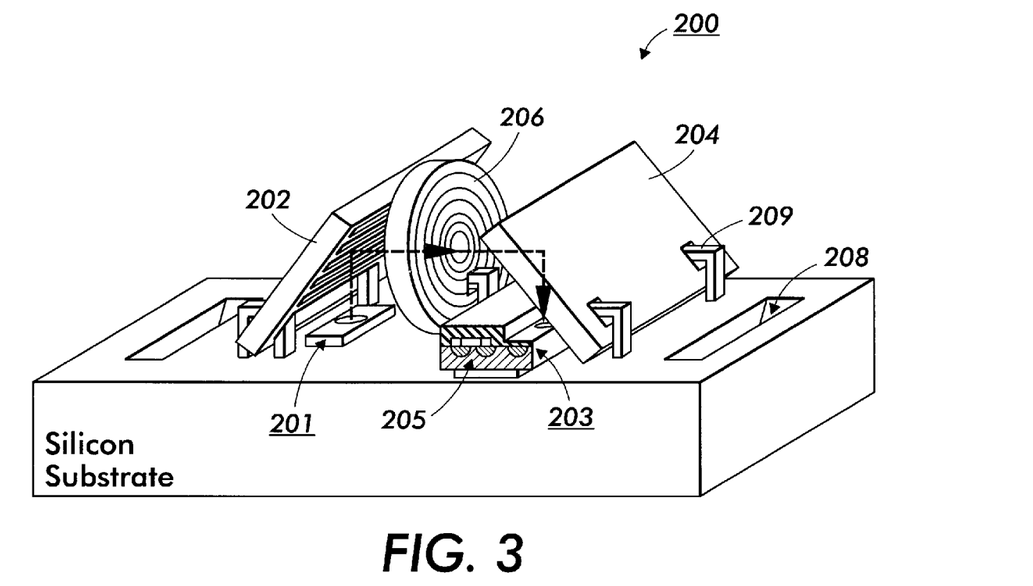
FIG. 3 illustrates in perspective view a MEMS device having various optical and mechanical elements formed in accordance with the process of the present invention.

As seen in FIG. 3, very complex MEMS and MOEMS devices can be constructed according to the present invention. Device 200 includes movable optical elements constructed from single crystal silicon overlaying an insulator such as a diffraction grating 202, a mirror 204, and a Fresnel lens 206. Active electronic elements can also be defined in the single crystal silicon layer, including flip chip bonded light producing laser diodes 201, light detecting photodiodes 203, or conventional CMOS logic circuitry 205. Bulk modifications required for packaging or mounting of the substrate are also possible, such as illustrated by etched cavity 208, and added polysilicon layers can be used for mechanical elements such as hinges 209.

To better understand the present invention, use of the following process steps 1–72 on a conventional SOI wafer to define a microstructure are presented:

| Step | Process | Specification |
|---|---|---|
| 1 | Photolithography Mask #1: Dimple | a) bake 110 degree C., 15 min<br>b) HMDS, 5.0 K, 30 sec<br>c) AZ1813, 4.0 K, 30 SEC, 1.3 um<br>d) softbake 90 C., 30 min<br>e) expose, 5.0 mW/cm², 12 sec<br>f) develop MF 319, 1.1 min<br>g) rinse, DI water, 4 min<br>h) spin dry<br>i) hardbake 110 degree C., 30 min |
| 2 | Etch Crystal Silicon | Reactive Ion Etch $SF_6 + O_2$ |
| 3 | Strip Photoresist | Hot PRS2000, 20 min<br>rinse DI water, 5 min<br>spin, dry |
| 4 | Photolithography Mask #2, CRY1 | a) bake 110 degree C., 15 min<br>b) HMDS, 5.OK, 30 sec<br>c) AZ1813, 4.OK, 30 SEC, 1.3 um<br>d) softbake 90 C., 30 min<br>e) expose, 5.0 mW/cm², 12 sec<br>f) develop MF 319, 1.1 min |

-continued

| Step | Process | Specification |
|---|---|---|
| | | g) rinse, DI water, 4 min |
| | | h) spin dry |
| | | i) hardbake 110 degree C., 30 min |
| 5 | Etch Crystal Silicon | STS silicon etch |
| 6 | Etch Oxide under Si | RIE:$CF_4$ + $CHF_3$, target etch rate:250 A/min |
| 7 | Strip Photoresist | Hot PRS2000, 20 min |
| | | rinse DI water, 5 min |
| | | spin, dry |
| 8 | Sacrificial Oxide Deposition | LPCVD PSG, 1.5 um |
| 9 | Photolithography Mask #3, Anchor 1 (Connect POLY1 to CRY1 or Substrate) | a) bake 110 degree C., 15 min |
| | | b) HMDS, 5.OK, 30 sec |
| | | c) AZ1813, 4.OK, 30 SEC, 2.7 um |
| | | d) softbake 90 C., 30 min |
| | | e) expose, 5.0 mW/$cm^2$, 12 sec |
| | | f) develop MF 319, 1.1 min |
| | | g) rinse, DI water, 4 min |
| | | h) spin dry |
| | | i) hardbake 110 degree C., 30 min |
| 10 | Oxide Etch | Reactive Ion Etch |
| | | $CF_4$ + $CHF_3$ |
| | | Strip Photoresist |
| 11 | Polysilicon Deposition | LPCVD, 2.0 um |
| 12 | PSG Deposition | LPCVD, PSG, 0.3 um |
| 13 | Annealing | 1100 degree C., 60 min |
| 14 | Photolithography Mask #4, POLY1 (Connect POLY1 to CRY1 or Substrate) | a) bake 110 degree C., 15 min |
| | | b) HMDS, 5.OK, 30 sec |
| | | c) AZ1813, 4.OK, 30 SEC, 2.7 um |
| | | d) softbake 90 C., 30 min |
| | | e) expose, 5.0 mW/$cm^2$, 12 sec |
| | | f) develop MF 319, 1.1 min |
| | | g) rinse, DI water, 4 min |
| | | h) spin dry |
| | | i) hardbake 110 degree C., 30 min |
| 15 | Oxide Etch | $CF_4$ + $CHF_3$ |
| 16 | Polysilicon Etch | $SF_6$ + $O_2$ |
| 17 | Strip Photoresist | Hot PRS2000, 20 |
| | | rinse DI water, 5 min |
| | | spin, dry |
| 18 | Photolithography Mask #5,P-Well | a) bake 110 degree C., 15 min |
| | | b) HMDS, 5.OK, 30 sec |
| | | c) AZ1813, 4.OK, 30 SEC, 2.7 um |
| | | d) softbake 90 C., 30 min |
| | | e) expose, 5.0 mW/$cm^2$, 12 sec |
| | | f) develop MF 319, 1.1 min |
| | | g) rinse, DI water, 4 min |
| | | h) spin dry |
| | | i) hardbake 110 degree C., 30 min |
| 19 | Implant Well | 2.5E13, 400 KeV, Boron |
| 20 | Strip Photoresist | Hot PRS2000, 20 min |
| | | rinse DI water, 5 min |
| | | spin, dry |
| 21 | Prefurnace Clean | RCA Clean |
| 22 | Pad Oxide | DWD/TCA, 900 C, 500A |
| 23 | Nitride Deposition | LPCVD nitride, 1200A |
| 24 | Mask #6, Active | a) bake 110 degree C., 15 min |
| | | b) HMDS, 5.OK, 30 sec |
| | | c) AZ1813, 4.OK, 30 SEC, 2.7 um |
| | | d) softbake 90 C., 30 min |
| | | e) expose, 5.0 mW/$cm^2$, 12 sec |
| | | f) develop MF 319, 1.1 min |
| | | g) rinse, DI water, 4 min |
| | | h) spin dry |
| | | i) hardbake 110 degree C., 30 min |
| 25 | Etch Nitride | RIE: $CF_4$ + $O_2$ |
| 26 | Hardbake Photoresist | |
| 27 | Photolithography Mask #7, P-Field | a) bake 110 degree C., 15 min |
| | | b) HMDS, 5.OK, 30 sec |
| | | c) AZ1813, 4.OK, 30 SEC, 2.7 um |
| | | d) softbake 90 C., 30 min |
| | | e) expose, 5.0 mW/$cm^2$, 12 sec |
| | | f) develop MF 319, 1.1 min |
| | | g) rinse, DI water, 4 min |
| | | h) spin dry |
| | | i) hardbake 110 degree C., 30 min |
| 28 | P-Field Implant | Boron, 5E13, 55KeV |
| 29 | Strip Photoresist | Standard Strip |
| 30 | Prefurnace Clean | |
| 31 | Field Oxidation | DWD/TCAm 1000C, 9000A |
| 32 | Remove Oxide on Nitride | BHF, 30 sec, rinse in DI Water, 4 min |
| 33 | Strip Nitride | phosphoric acid, 180 degree C. |
| 34 | Etch pad Oxide | BHF, 30 sec, rinse in DI water, 4 min |
| 35 | Prefurnace Clean | RCA Clean |
| 36 | Grow Sacrificial Oxide | DWD/TCA, 1000 C, 500A |
| 37 | Threshold Implant | Boron, 6.5E11, 35KeV |
| 38 | Strip Oxide | BHF, 30 sec, rinse in DI Hydrophobic |
| 39 | Prefurnace Clean | RCA Clean |
| 40 | Grow Gate Oxide | DA1, 1000 C, 400A |
| 41 | Deposit Gate Poly | LPCVD, Poly 5000A |
| 42 | Dope Poly | B3, Phosdep2 < 20 ohm/square |
| 43 | Photolithography ask #8, Gate | a) bake 110 degree C., 15 min |
| | | b) HMDS, 5.OK, 30 sec |
| | | c) AZ1813, 4.OK, 30 SEC, 2.7 um |
| | | d) softbake 90 C., 30 min |
| | | e) expose, 5.0 mW/$cm^2$, 12 sec |
| | | f) develop MF 319, 1.1 min |
| | | g) rinse, DI water, 4 min |
| | | h) spin dry |
| | | i) hardbake 110 degree C., 30 min |
| 44 | Etch Poly | RIE:$SF_6$ + $O_2$ |
| 45 | Strip Photoresist | Standard Strip |
| 46 | Prefurnace Clean | RCA Clean |
| 47 | Grow Capacitor Oxide | DA1, 1000 C, 750A |
| 48 | Deposit Poly2 | LPCVD Poly, 5500A |
| 49 | Dope Poly2 | B3, Phosphorus < 20 ohm/square |
| 50 | Mask #9, Poly2 | a) bake 110 degree C., 15 min |
| | | b) HMDS, 5.OK, 30 sec |
| | | c) AZ1813, 4.OK, 30 SEC, 2.7 um |
| | | d) softbake 90 C., 30 min |
| | | e) expose, 5.0 mW/$cm^2$, 12 sec |
| | | f) develop MF 319, 1.1 min |
| | | g) rinse, DI water, 4 min |
| | | h) spin dry |
| | | i) hardbake 110 degree C., 30 min |
| 51 | Poly2 Etch | RIE, $SF_6$ + $O_2$ |
| 52 | Strip Photoresist | PRS 2000, 20 min |
| 53 | Prefurnace Clean | RCA Clean |
| 54 | Reoxidation | B4, DWDA1, 800 c, 1200A |
| 55 | Mask #10, P + Implant | a) bake 110 degree C., 15 min |
| | | b) HMDS, 5.OK, 30 sec |
| | | c) AZ1813, 4.OK, 30 SEC, 2.7 um |
| | | d) softbake 90 C., 30 min |
| | | e) expose, 5.0 mW/$cm^2$, 12 sec |
| | | f) develop MF 319, 1.1 min |
| | | g) rinse, DI water, 4 min |
| | | h) spin dry |
| | | i) hardbake 110 degree C., 30 min |
| 56 | P + Implant | 7E15, 40KeV, Boron |
| 57 | Strip Photoresist | Hot PRS2000, 20 min |
| 58 | Photolithography Mask #10, P + Implant (Image Reversal) | |
| | | a) bake 110 degree C., 15 min |
| | | b) HMDS, 5.0K, 30 sec |
| | | c) AZ5214, 4.OK, 30 SEC, 2.7 um |
| | | d) softbake 90 C., 30 min |
| | | e) expose, 5.0 mW/$cm^2$, 12 sec |
| | | f) Soft bake, 100 C., 30 min |
| | | g) Flood Expose, 42 sec |
| | | h) Develop AZ312, 1.1 min |
| | | i) Rinse, DI water, 4 min |
| | | j) spin dry |
| | | k) postbake 110 C., 30 min |
| 59 | N + Implant | Phosphorus, 8E15, 70KeV |
| 60 | Strip Photoresist | Hot PRS2000, 20 min |
| 61 | Prefurnace Clean | RCA Clean |
| 62 | Deposit CVD Oxide | LTO 0.5 um |
| 63 | Mask #11, CONTACTS | a) bake 110 degree C., 15 min |
| | | b) HMDS, 5.OK, 30 sec |
| | | c) AZ1813, 4.OK, 30 SEC, 2.7 um |
| | | d) softbake 90 C., 30 min |

-continued

| Step | Process | Specification |
|---|---|---|
| | | e) expose, 5.0 mW/cm$^2$, 12 sec |
| | | f) develop MF 319, 1.1 min |
| | | g) rinse, DI water, 4 min |
| | | h) spin dry |
| | | i) hardbake 110 degree C., 30 min |
| 64 | Etch Contacts | RIE, CF$ + CHF3 |
| 65 | Strip Photoresist | Hot PRS2000, 20 min |
| 66 | Mask#12, Metal | a) bake 110 degree C., 15 min |
| | | b) HMDS, 5.OK, 30 sec |
| | | c) AZ1813, 4.OK, 30 SEC, 2.7 um |
| | | d) softbake 90 C., 30 min |
| | | e) expose, 5.0 mW/cm$^2$, 12 sec |
| | | f) develop MF 319, 1.1 min |
| | | g) rinse, DI water, 4 min |
| | | h) spin dry |
| | | i) hardbake 110 degree C., 30 min |
| 67 | Sputter Cr/Au | Cr/Au:300A/3000A |
| 68 | Lift-off | Hot 1112A |
| 69 | Clean Water | ACE/IPA |
| 70 | Eutectic bonding | Bond a LED/Laser Diode to the Substrate |
| 71 | Water Dicing | |
| 72 | Microstructure Release | HF:water = 1:1 |
| | | Rinse DI water |

Figure 4:
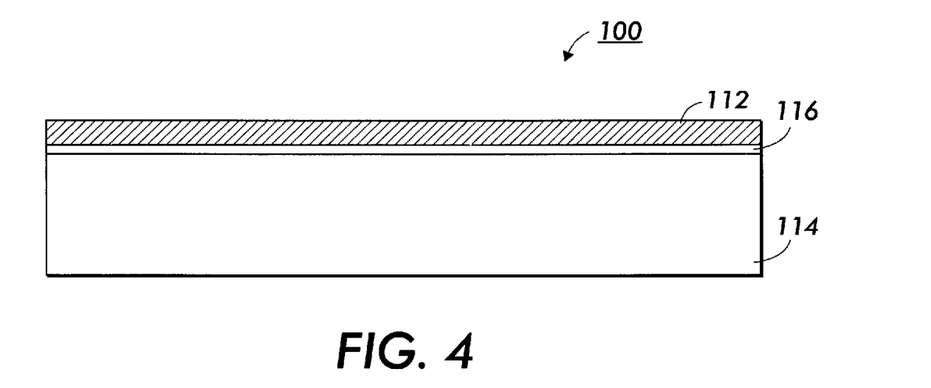
FIGS. 4–17 illustrate process steps to form a MEMS device such as illustrated in FIG. 3.
Figure 5:
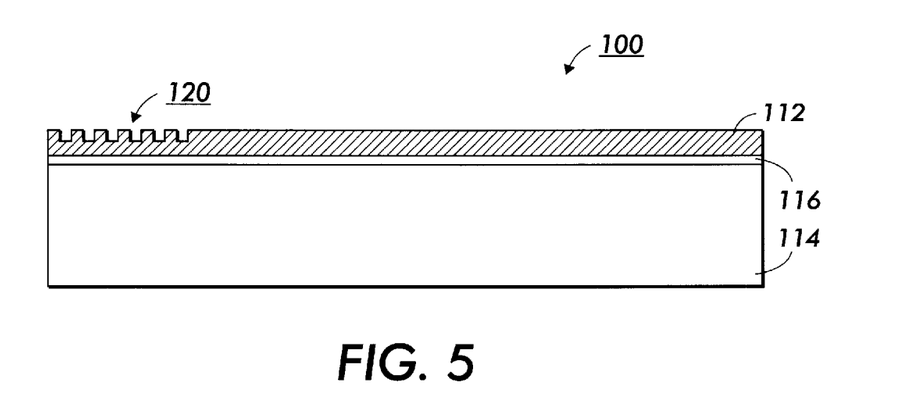
Figure 6:
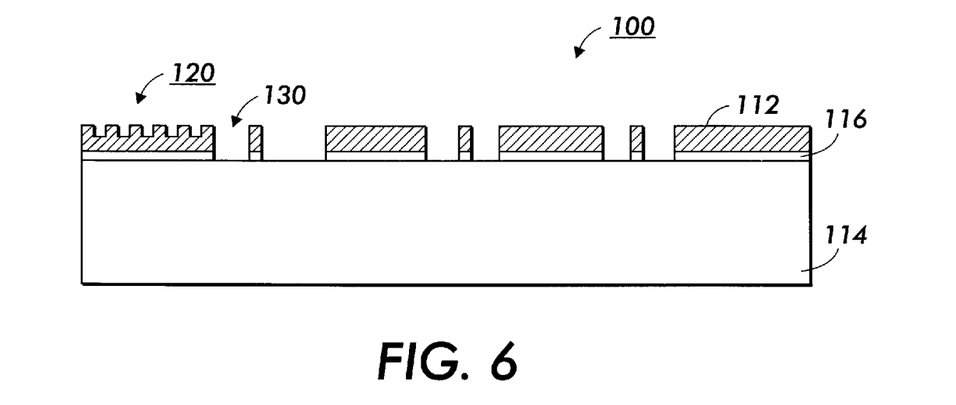
Figure 7:
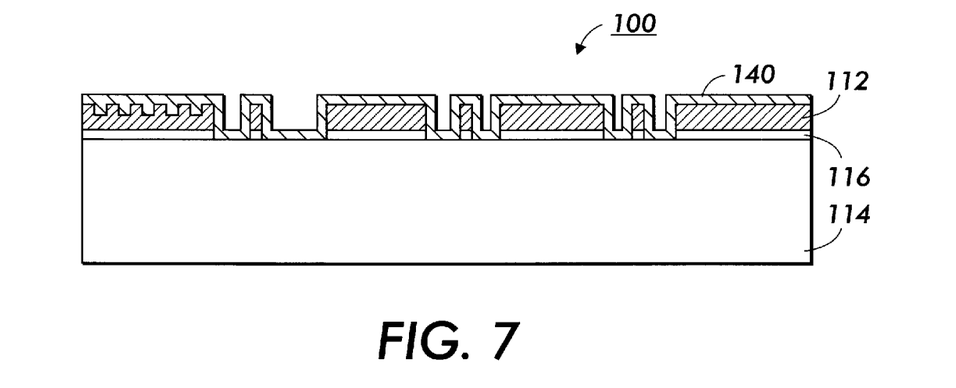

To better understand the foregoing microstructure process steps 1–72, consideration of FIGS. 4–17 illustrate manufacture of a device such as discussed in connection with FIG. 3, substantially using the foregoing microstructure process steps 1–72. As seen in FIG. 4, a bonded SOI wafer 100 includes a thin silicon crystal layer 112, and a thick crystal silicon handle wafer layer 114. Between these two layers 112 and 114 there is an oxide layer 116 that integrally bonds the silicon crystal layer 112 and handle wafer layer 114.

Figure 8:
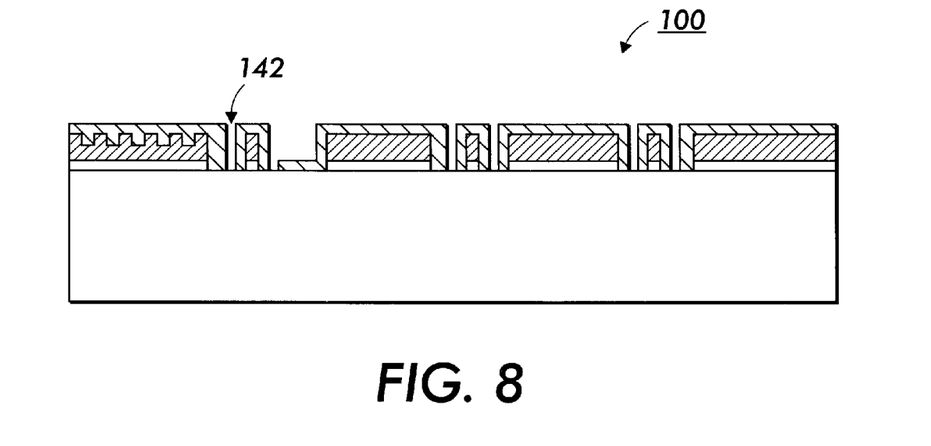
Figure 9:
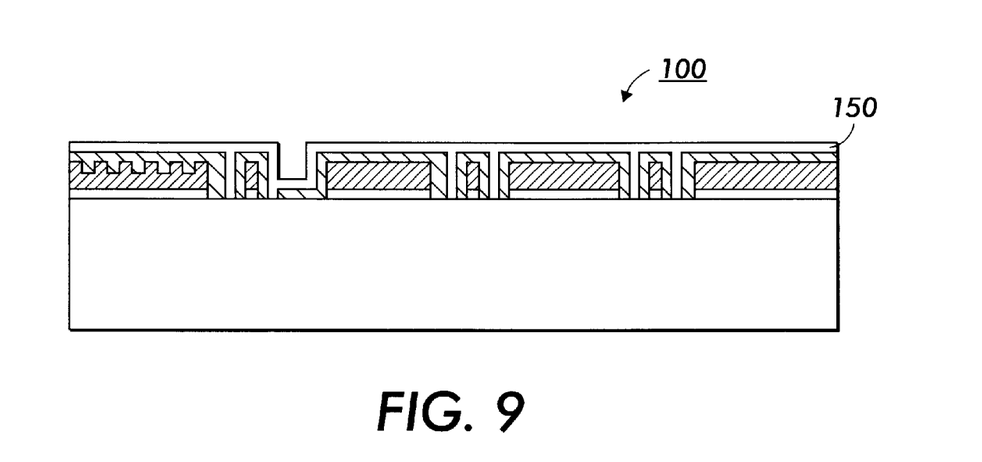
Figure 10:
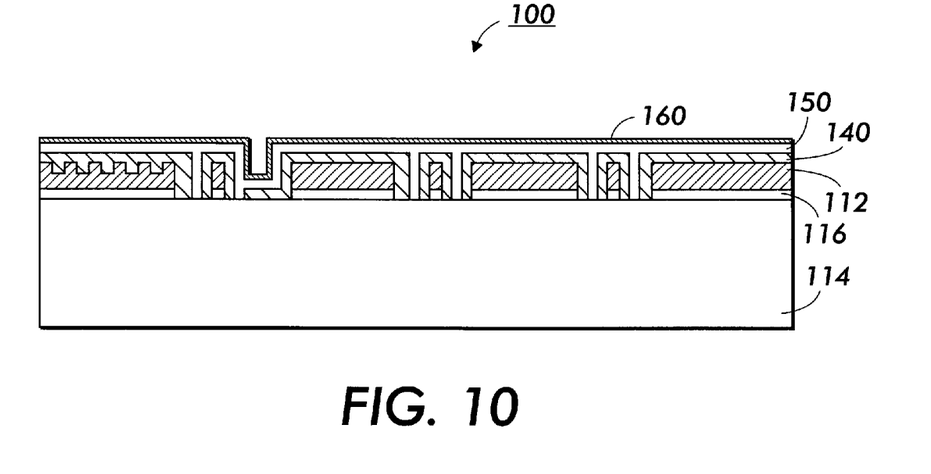
Figure 11:
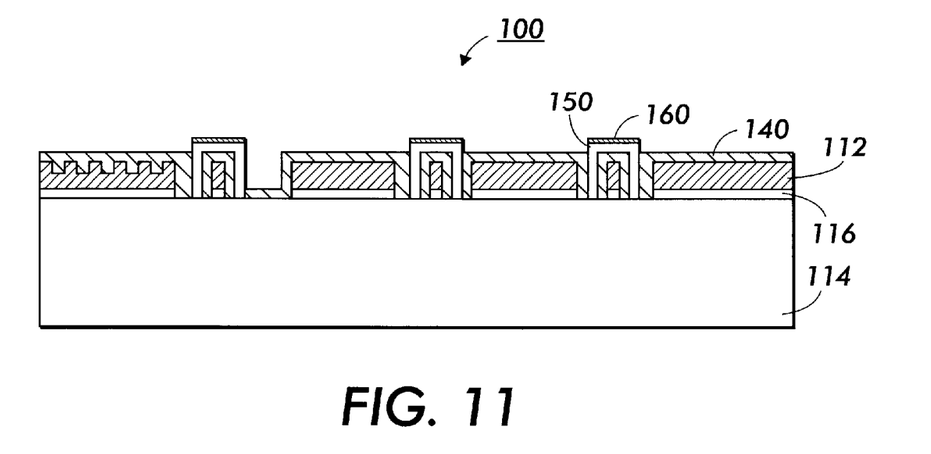

Using photolithographic, etch, and strip photoresist techniques (FIG. 5, Steps 1–3) a dimple structure 120 having parallel grooves capable of acting as a diffraction grating is defined in the layer 112. The combination of photolithography and dry etch (FIG. 6, Steps 4–7) is used to cut through the layer 112 and 116 in area 130. A layer of 1.5 micron thick sacrificial oxide layer 140 is deposited (FIG. 7, Step 8), and anchor holes are etched through the layer 140 in defined areas 142 (FIG. 8, Steps 9–10). A layer 150 of structural polysilicon 2 microns thick is deposited (FIG. 9, Step 11), followed by deposition of 0.3 microns of a phosphosilicate glass (PSG) layer 160 (FIG. 10, Steps 12–13).

Figure 12:
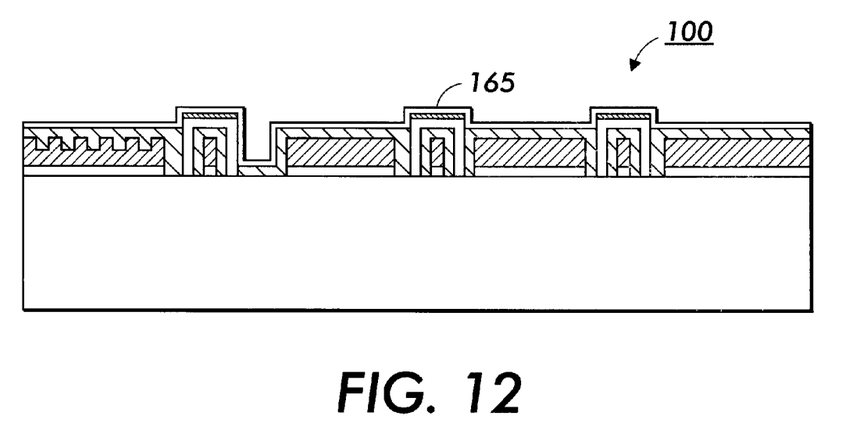
Figure 13:
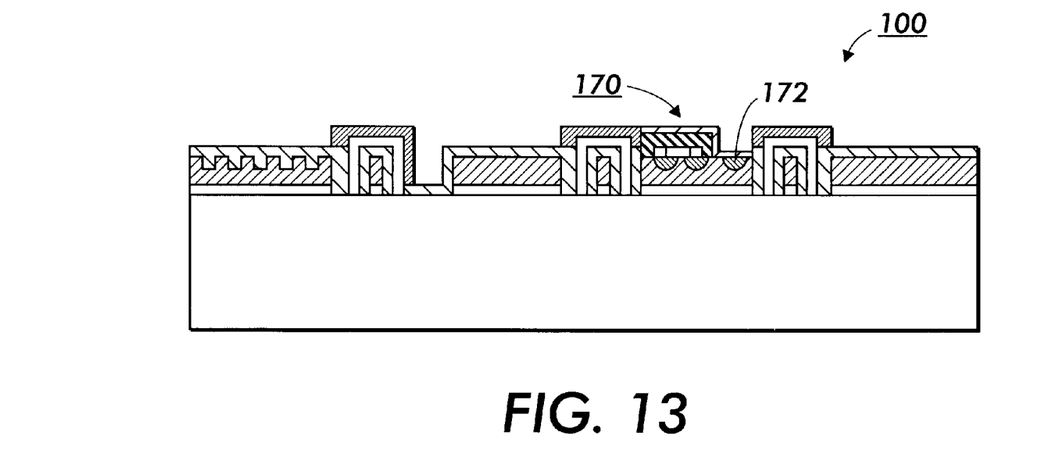
Figure 14:
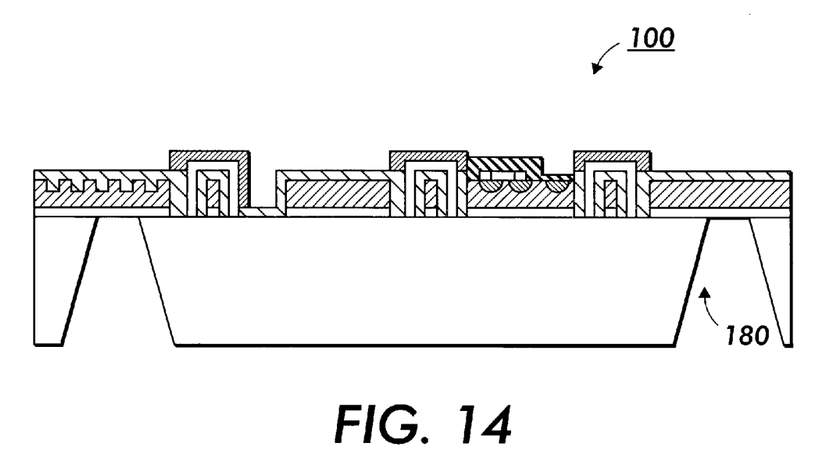
Figure 15:
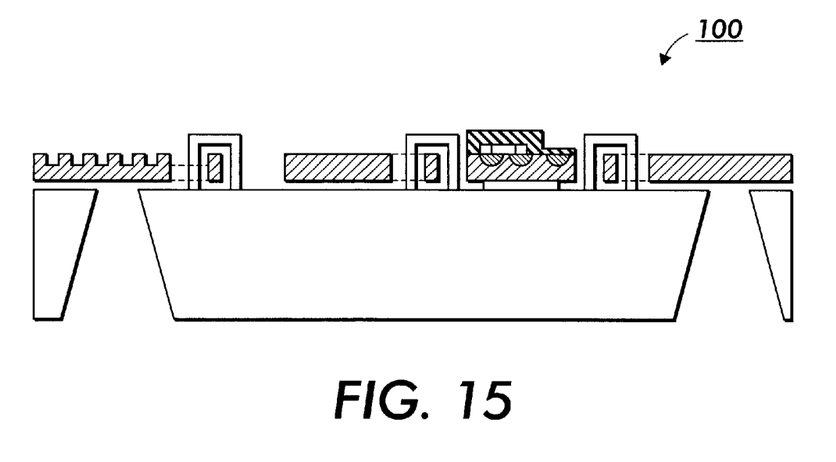
Figure 16:
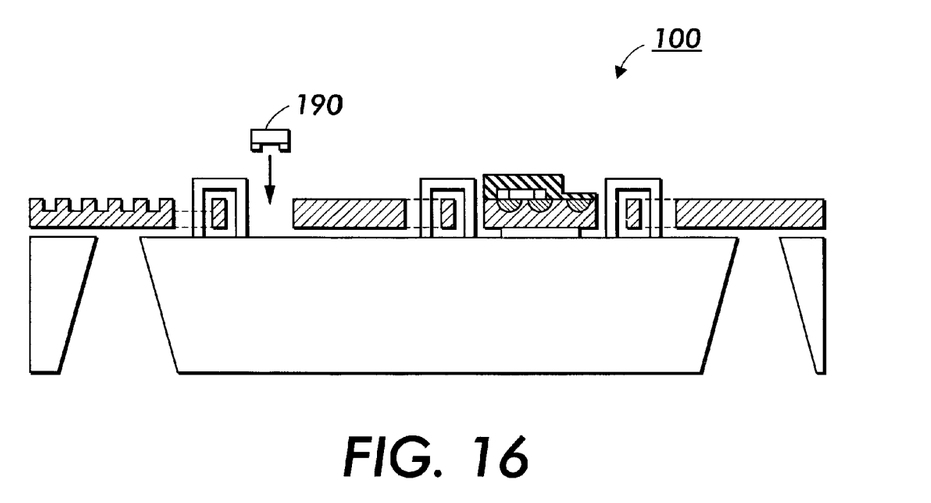
Figure 17:
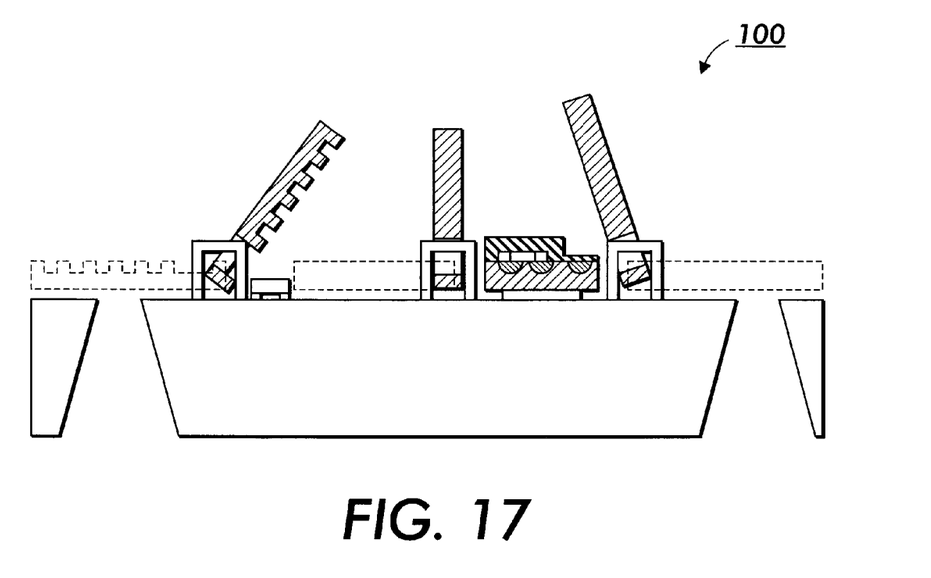

The PSG layer 160 and polysilicon layer 150 are selectively etched (FIG. 11, Steps 14–17) and low pressure chemical vapor deposition (LPCVD) is used to deposit a protecting nitride layer 165 to protect partially formed structures (FIG. 12, Steps 18–23). Complementary metal oxide silicon (CMOS) logic circuitry 170 and sensor photodiodes 172 are integrated (FIG. 13, Steps 24–69), wet etch is used to define holes 180 for bulk micromachining (FIG. 14), and silicon microstructures are released. Final process steps may include flip chip bonding of a laser diode 190 (FIG. 16, Step 70), and packaging or assembly steps including wafer dicing 71, microstructure release, and hinged movement of a diffraction grating, Fresnel lens, and mirror into position (FIG. 17, Step 72), to a position substantially as seen in perspective view in FIG. 3.

As those skilled in the art will appreciate, other various modifications, extensions, and changes to the foregoing disclosed embodiments of the present invention are contemplated to be within the scope and spirit of the invention as defined in the following claims.

What is claimed is:

1. A microstructure produced by a process comprising the steps of
   defining a device structure in a single-crystal silicon layer separated by an insulator layer from a handle wafer;
   selectively etching the single crystal silicon layer;
   depositing a sacrificial oxide layer on the etched single crystal layer;
   depositing a polysilicon layer on the sacrificial oxide layer;
   depositing a protective oxide layer;
   integrating CMOS circuitry and sensors, and
   releasing formed silicon microstructures having sensors connected to CMOS circuitry.

2. The microstructure produced by a process of claim 1 wherein the step of defining a device structure further comprises the step of using an oxide layer as the insulator layer.

3. The microstructure produced by a process of claim 1 further comprising the step of wafer bonding the single crystal silicon layer to the handle wafer with the intermediate insulator layer.

4. The microstructure produced by a process of claim 1 wherein the step of selectively etching the single crystal silicon further comprises the step photolithographically patterning and dry etching the single crystal silicon layer.

5. A microstructure produced by a process comprising the steps of
   defining a device structure in a single-crystal silicon layer separated by an oxide layer from a handle wafer;
   selectively etching the single crystal silicon layer;
   photolithographically patterning and etching the selectively etched single crystal silicon layer and the oxide layer,
   depositing a sacrificial oxide layer on the etched single crystal layer and handle wafer;
   etching holes through the sacrificial oxide layer;
   depositing and patterning a polysilicon layer on the sacrificial oxide layer;
   integrating CMOS circuitry and sensors, and
   releasing formed silicon microstructures having sensors connected to CMOS circuitry.

6. The microstructure produced by a process of claim 5 further comprising the step of wafer bonding the single crystal silicon layer to the handle wafer with the intermediate insulator layer.

7. The microstructure produced by a process of claim 5 further comprising the steps of
   depositing a PSG layer on the polysilicon layer;
   patterning the PSG layer and polysilicon layer;
   depositing a protective oxide layer prior to releasing formed silicon microstructures.

8. A microstructure produced by a process comprising the steps of
   defining a device structure in a single-crystal silicon layer separated by an oxide layer from a handle wafer;
   photolithographically patterning and etching etching the single crystal silicon layer;
   depositing a sacrificial oxide layer on the etched single crystal layer and handle wafer;
   photolithographically patterning and etching the selectively etched single crystal silicon layer and the oxide layer, etching holes through the sacrificial oxide layer;

depositing a sacrificial oxide layer on the etched single crystal layer;

depositing a polysilicon layer on the sacrificial oxide layer;

depositing a PSG layer on the polysilicon layer;

patterning the PSG layer and polysilicon layer; and integrating sensors with silicon microstructures previously formed, and releasing formed silicon microstructures having sensors.

* * * * *

UNITED STATES PATENT AND TRADEMARK OFFICE
CERTIFICATE OF CORRECTION

PATENT NO.    : 6,362,512 B1                                                Page 1 of 1
DATED         : March 26, 2002
INVENTOR(S)   : Joel A Kubby et al.

It is certified that error appears in the above-identified patent and that said Letters Patent is hereby corrected as shown below:

<u>Column 1,</u>
Line 10, insert:
-- This invention was made with United States Government support under Agreement No. 70NANB8H4014 awarded by NIST. The United States Government has certain rights in this invention. --.

Signed and Sealed this

Thirtieth Day of May, 2006

JON W. DUDAS
*Director of the United States Patent and Trademark Office*